(12) United States Patent
Kikuchi et al.

(10) Patent No.: US 7,399,694 B2
(45) Date of Patent: Jul. 15, 2008

(54) SEMICONDUCTOR DEVICE AND A MANUFACTURING METHOD OF THE SAME

(75) Inventors: Takashi Kikuchi, Tokyo (JP); Koichi Kanemoto, Tokyo (JP); Michiaki Sugiyama, Tokyo (JP); Hiroshi Kawakukbo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 52 days.

(21) Appl. No.: 11/482,764

(22) Filed: Jul. 10, 2006

(65) Prior Publication Data

US 2007/0013083 A1   Jan. 18, 2007

(30) Foreign Application Priority Data

Jul. 14, 2005   (JP) .............................. 2005-205027

(51) Int. Cl.
*H01L 23/48* (2006.01)
*H01L 21/44* (2006.01)

(52) U.S. Cl. ................ 438/612; 257/786; 257/E23.021

(58) Field of Classification Search ......... 438/106–127, 438/612; 257/786, E23.001, E23.01, E23.021; 174/125.1, 250–268; 361/728–837
See application file for complete search history.

(56) References Cited

U.S. PATENT DOCUMENTS 6,943,100 B2 *   9/2005   Chinda et al. ............... 438/612
2004/0043537 A1 *   3/2004   Tomihara .................... 438/113

FOREIGN PATENT DOCUMENTS

JP   9-232736 A   9/1997
JP   2000-031630 A   1/2000

* cited by examiner

*Primary Examiner*—Matthew S. Smith
*Assistant Examiner*—Walter H Swanson
(74) *Attorney, Agent, or Firm*—Miles & Stockbridge P.C.

(57) ABSTRACT

By preparing a package substrate which has a plurality of lands of NSMD structure, and the output wiring and dummy wiring which were connected to each of the lands, and have been arranged mutually in location of 180° symmetry, and printing solder by a printing method to the lands after the package assembly, the variation in the height of the solder coat between lands can be reduced, and improvement in the mountability of LGA (semiconductor device) is achieved.

11 Claims, 14 Drawing Sheets

SEMICONDUCTOR DEVICE AND A MANUFACTURING METHOD OF THE SAME

CROSS-REFERENCE TO RELATED APPLICATION

The present application claims priority from Japanese patent application No. 2005-205027 filed on Jul. 14, 2005, the content of which is hereby incorporated by reference into this application.

1. Field of the Invention

The present invention relates to semiconductor manufacturing technology, and particularly relates to an effective technology in the application to the improvement in a mountability of a semiconductor device.

2. Description of the Background Art

A printed circuit board has a circuit pattern and an insulating substrate which has a land connected with the circuit pattern and for joining a solder ball and a solder resist layer in which a hole for junction for solder ball junction for exposing a part of this land was formed. In a certain diametral direction of the land, both ends of the land have formed an interval part between them and the surface of a wall of the hole for junction (for example, refer to Patent Reference 1)

The connection structure of a semiconductor integrated circuit element and a wiring substrate is the structure of a pad which has a lead-out pattern which was covered by the resist and surrounded by non-conductive space in the outer edge on the surface of a printed-circuit board, and increases the junction area between it and the printed-circuit board (for example, refer to Patent Reference 2).

[Patent Reference 1] Japanese Unexamined Patent Publication No. Hei 9-232736 (FIG. 1)

[Patent Reference 2] Japanese Unexamined Patent Publication No. 2000-31630 (FIG. 1)

SUMMARY OF THE INVENTION

For example, the semiconductor device built into memory cards, such as SD (Secure Digital) (there is a standard standardized at the SD card association) and a memory stick card, requires the thin shape. There are some into which the semiconductor device which has a controller chip, and the semiconductor device which has a memory chip are built in memory cards. Since the memory needs to increase the capacity in the case, a memory chip may be laminated in many stages, but the package thickness also becomes thick by that part.

Therefore, as a form of the semiconductor device built into a memory card, the LGA (Land Grid Array) whose thickness is thinner than BGA (Ball Grid Array) and CSP (Chip Size Package) which includes equivalent size mostly with chip size is more effective. BGA and CSP are mounted on a mother board by using as an external terminal the ball electrode formed on the land. The height from the front surface of a land to the peak in the solder coat formed by the ball supplying method is larger than 100□m, and the JEDEC (Joint Electron Device Engineering Council standards) standard of a BGA type package or a CSP type package is satisfied. On the other hand, since LGA is mounted on a mother board using a land as an external terminal, it is possible to make thin the thickness of the semiconductor device by the part which does not use a ball electrode. However, since the external terminal is a land, the mounting strength of LGA is low. There is a semiconductor device which ships by making the coat of the solder to each land beforehand as measures which improve the mounting strength of LGA.

The technology called NSMD (Non Solder Mask Defined) is known as a technology of the land structure which improves the bond strength of the land of a substrate, and solder. In NSMD, since the front surface and the side face of a land are exposed to opening of the resist, therefore solder turns also to the side face of the land, the bond strength of a land and solder can be raised.

As a result, in LGA, in order to improve the mountability, the solder coat to a land and adopting NSMD as a land structure are preferred.

It is more desirable to adopt not the ball supplying method but the printing method in LGA included in a memory card in performing a solder coat to the land. In the case-of a small solder ball (for example, the small solder ball less than diameter 100□m), as this reason, it is easy to be influenced by static electricity since it is light, and it is difficult to treat since it is hard to separate from a jig, adhering to a jig.

However, the printing method has little amount of supply of solder as compared with the ball supplying method. When there is much amount of supply of solder, even if the variation in the height of some solder will occur, also in the land on which the height of solder was formed low, the coat of the amount of solder of the grade which can secure mounting strength with a mother board is made. On the other hand, when there was too little amount of supply of solder and the variation in the height of solder occurs, in the land on which the height of solder was formed low, the coat of the amount of solder of the grade which can secure mounting strength with a mother board is not made. In other words, since it is preferred to make the coat only of the amount of a grade which can secure mounting strength as to the amount of supply of the solder used in order to improve mounting strength since it is wanted to make thickness of a semiconductor device as thin as possible in the case of the semiconductor device built into a memory card, even if slight height variations occur, it becomes lowering of mounting reliability.

In LGA which adopted NSMD structure, although the output wiring for is connected to each land, when a number which is different like 1 or 2 is intermingled for every land in the number of these output wirings, the areas of solder which wet and spread will differ for every land, and, as a result, the problem that variation occurs in the height of solder will arise.

The problem that solder is pulled to the output wiring side on a land, and the location of the peak of a solder coat shifts from near the center of the land arises. When the location of the peak of solder shifts according to the direction of taking out of a wiring, it is a problem at the time of testing in the screening step of a semiconductor device (LGA) to cause a contact failure with the terminal of a socket.

In the Patent Reference 1 (Japanese Unexamined Patent Publication No. Hei 9-232736) and Patent Reference 2 (Japanese Unexamined Patent Publication No. 2000-31630), the description which was conscious of the thin shape of the semiconductor device, and the description about LGA are not found.

A purpose of the present invention is to offer the technology in which improvement in the mountability of a semiconductor device can be aimed at.

The above-described and the other purposes and novel features of the present invention will become apparent from the description herein and accompanying drawings.

Of the inventions disclosed in the present application, typical ones will next be summarized briefly.

That is, the present invention comprises the steps of preparing a wiring substrate which has a back surface opposite to the main surface, an insulating film formed over the back surface, a plurality of lands which are formed over the back surface, and whose edge part exposes to an opening of the insulating film, and a first and a second wirings that are connected to each of the lands, and are arranged mutually in a location of 180° symmetry, mounting a semiconductor chip over the main surface of the wiring substrate, and printing solder by a printing method to the lands.

And, the present invention comprises the steps of preparing a wiring substrate which has a back surface opposite to the main surface, an insulating film formed over the back surface, a plurality of lands which are formed over the back surface, and whose edge part exposes to an opening of the insulating film, and a plurality of wirings which are connected to each of the lands, and are arranged so that a mutual arrangement angle is 360°/a number of connection wirings, mounting a semiconductor chip over the main surface of the wiring substrate, and printing solder by a printing method to the lands.

Further, the present invention comprises a wiring substrate which has a back surface opposite to the main surface, an insulating film formed over the back surface, a plurality of lands which are formed over the back surface, and whose edge part exposes to an opening of the insulating film, and a plurality of wirings connected to each of the lands, a semiconductor chip mounted over the main surface of the wiring substrate, and a conductive member which electrically connects the wiring substrate and the semiconductor chip, wherein the wirings are arranged so that a mutual arrangement angle is 360°/a number of connection wirings.

Advantages achieved by some of the most typical aspects of the invention disclosed in the present application will be briefly described below.

By preparing a wiring substrate having a plurality of lands where the edge part exposes to opening of an insulating film and the first and the second wirings that were connected to each of a plurality of lands, and has been arranged mutually in the location of 180° symmetry, and printing solder with a printing method to a plurality of lands after the assembly, the variation in the height of the solder coat between lands can be reduced, and improvement in the mountability of a semiconductor device can be aimed at.

DETAILED DESCRIPTION OF THE PREFERRED EMBODIMENTS

Figure 1:
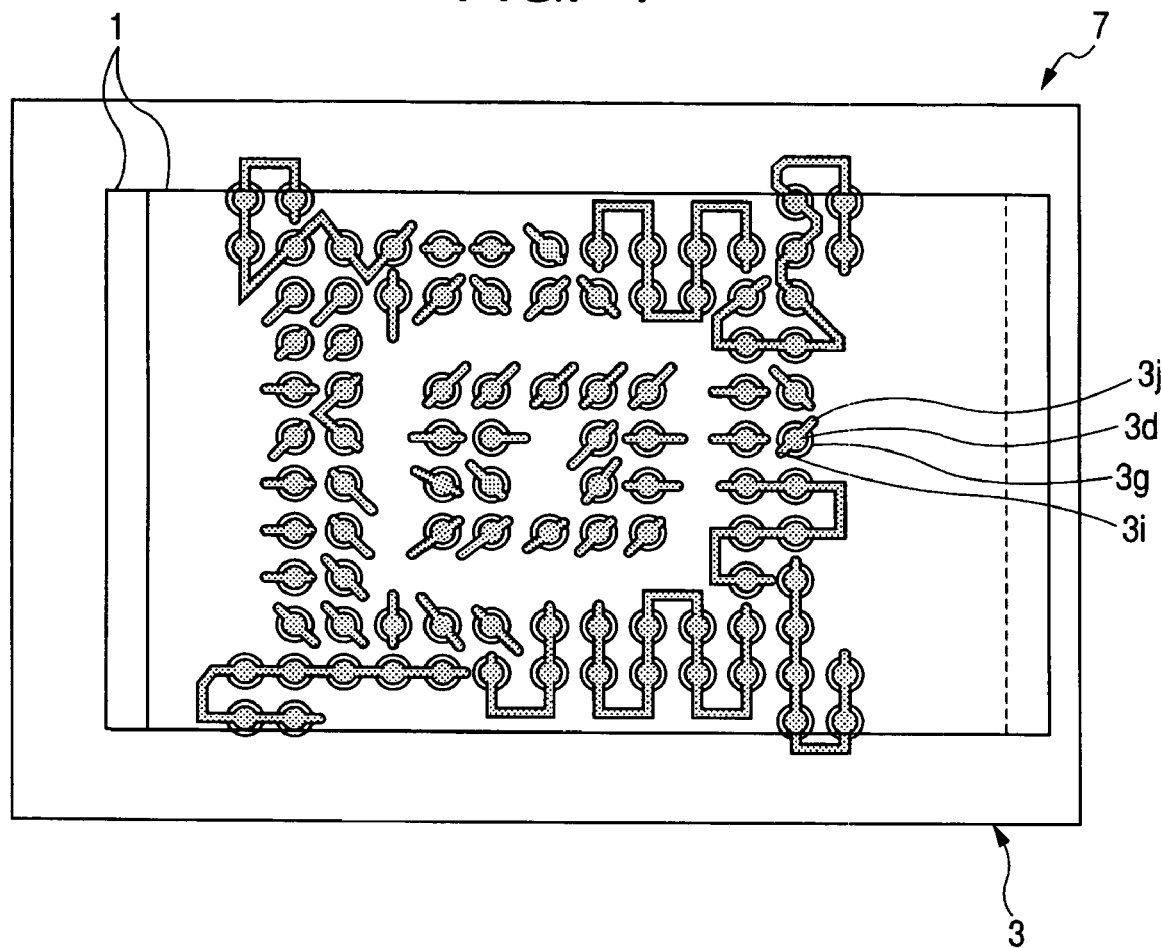
FIG. 1 is a cutaway view showing an example of the arrangement relation between a chip and a land in the structure of the semiconductor device of the Embodiment of the present invention.

In the following embodiments, except the time when especially required, explanation of identical or similar part is not repeated in principle.

Further, in the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated.

In the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number.

Hereafter, embodiments of the invention are explained in detail based on drawings. In all the drawings for describing the embodiments, members of a like function will be identified by like reference numerals and overlapping descriptions will be omitted.

EMBODIMENT

Figure 2:
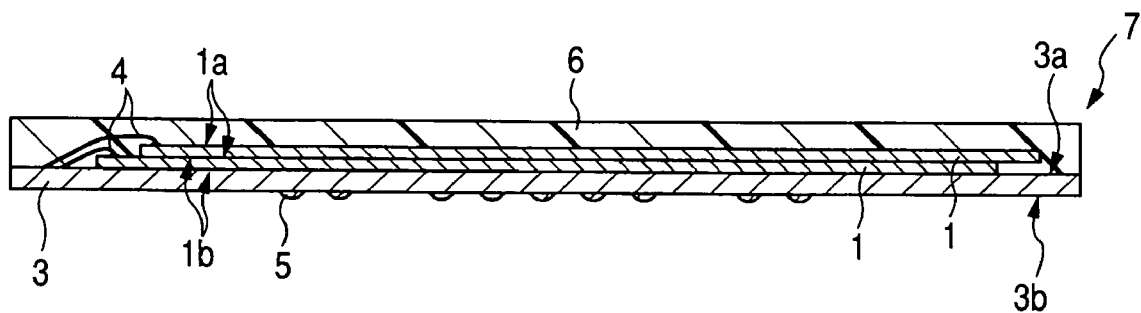
FIG. 2 is a cross-sectional view showing an example of the structure of the semiconductor device shown in FIG. 1.
Figure 3:
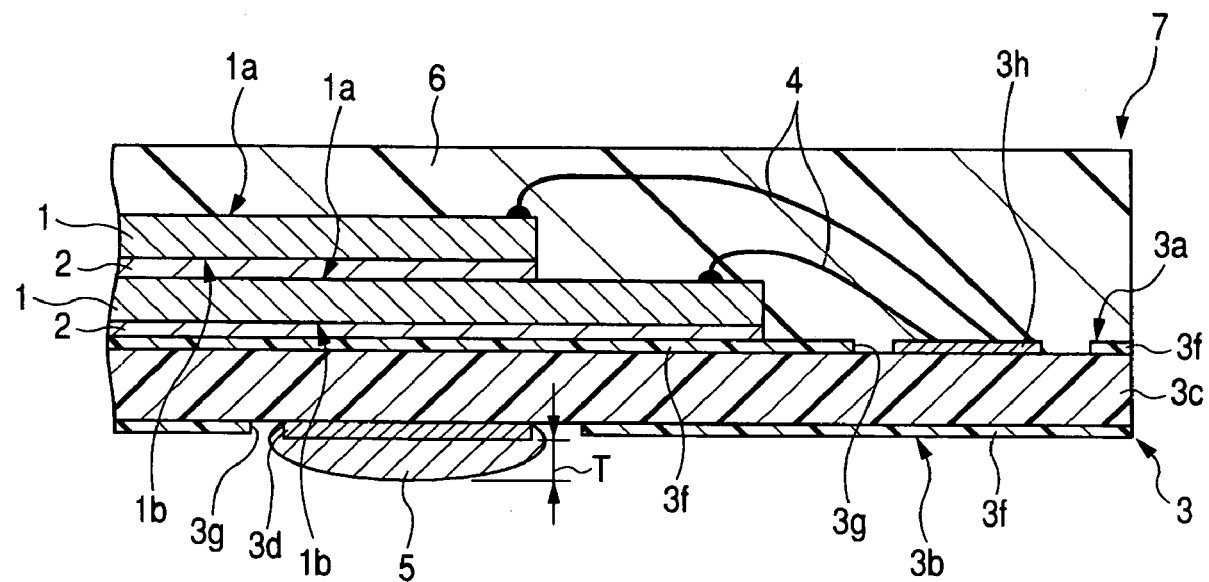
FIG. 3 is an enlarged partial sectional view showing an example of the structure of the semiconductor device shown in FIG. 2.
Figure 4:
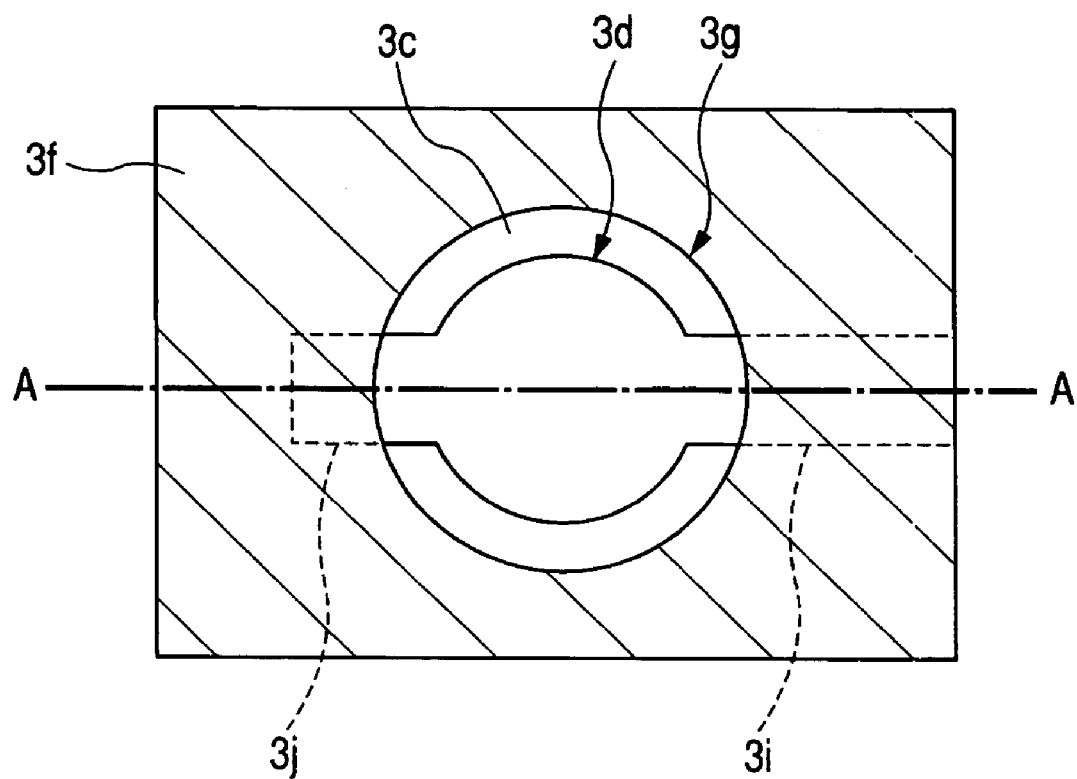
FIG. 4 is a partial plan view showing an example of the structure of the land of the semiconductor device shown in FIG. 1.
Figure 5:
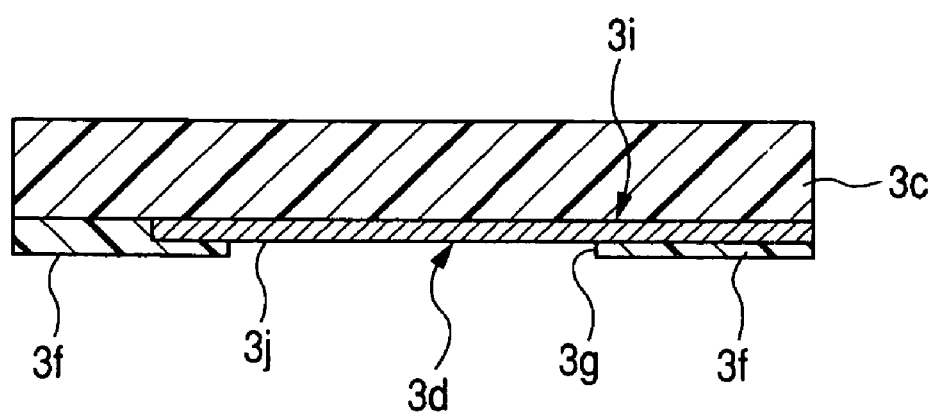
FIG. 5 is a cross-sectional view showing the structure cut along the A-A line of FIG. 4.
Figure 6:
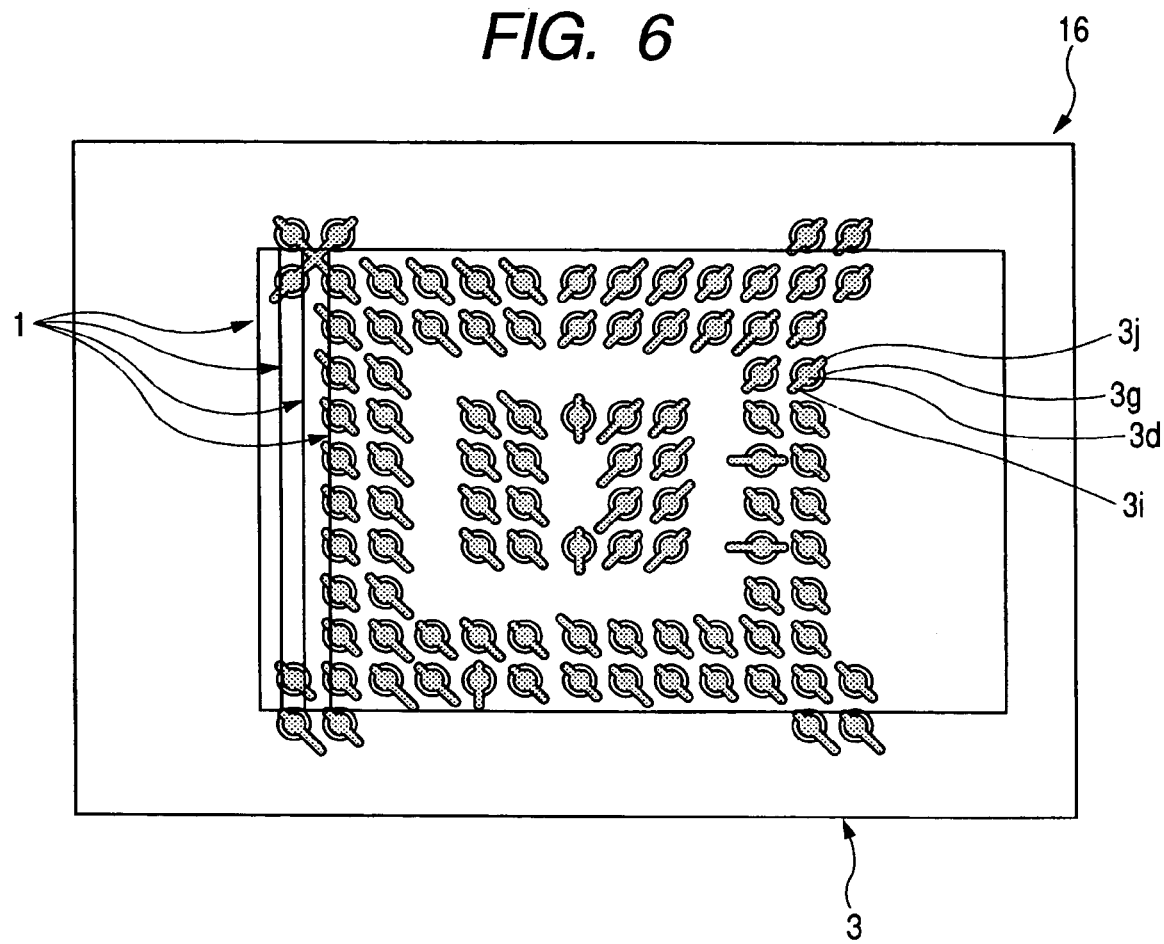
FIG. 6 is a cutaway view showing the arrangement relation between a chip and a land in the structure of the semiconductor device of the modification of the Embodiment of the present invention.
Figure 7:
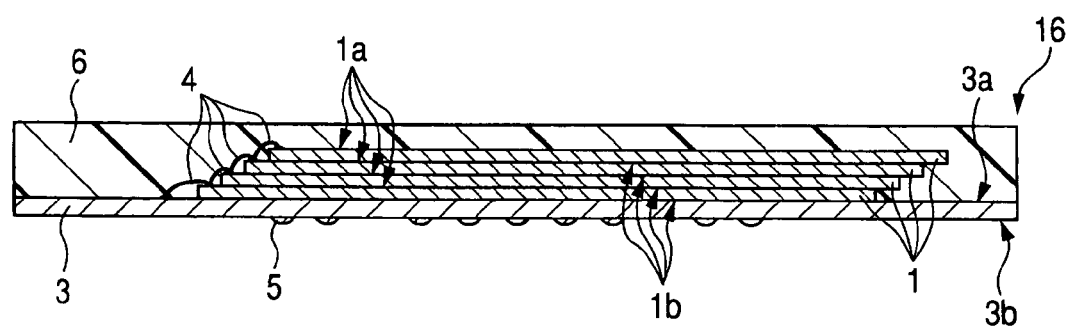
FIG. 7 is a cross-sectional view showing the structure of the semiconductor device of the modification shown in FIG. 6.
Figure 8:
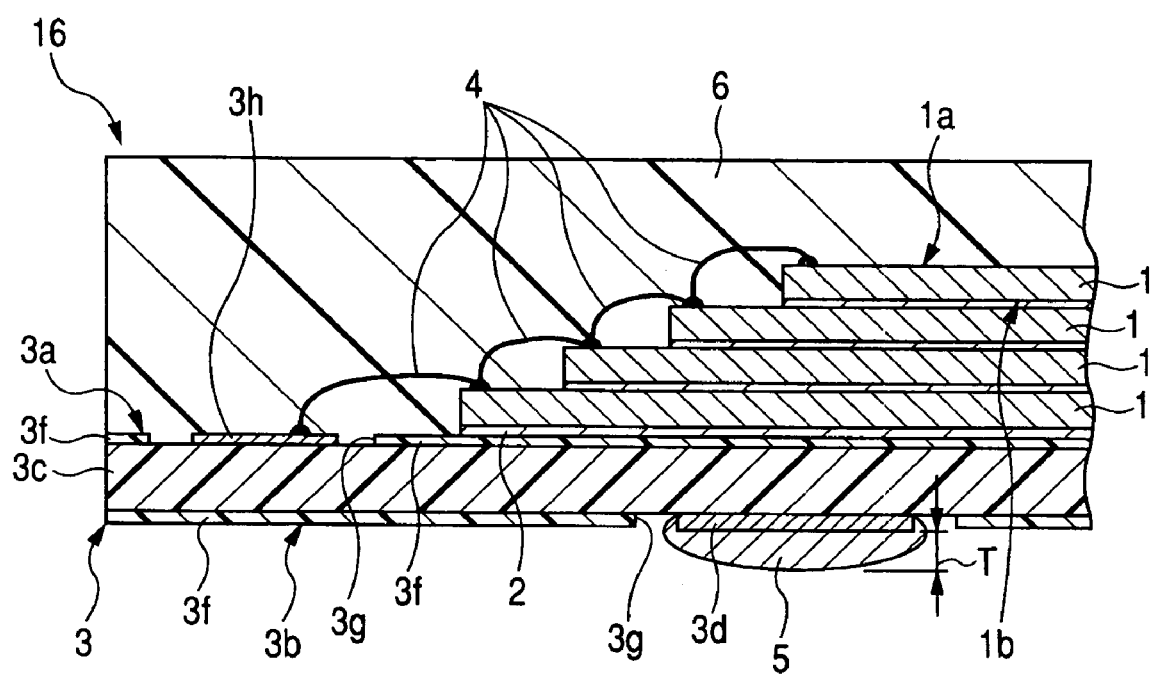
FIG. 8 is an enlarged partial sectional view showing an example of the structure of the semiconductor device shown in FIG. 7.
Figure 9:
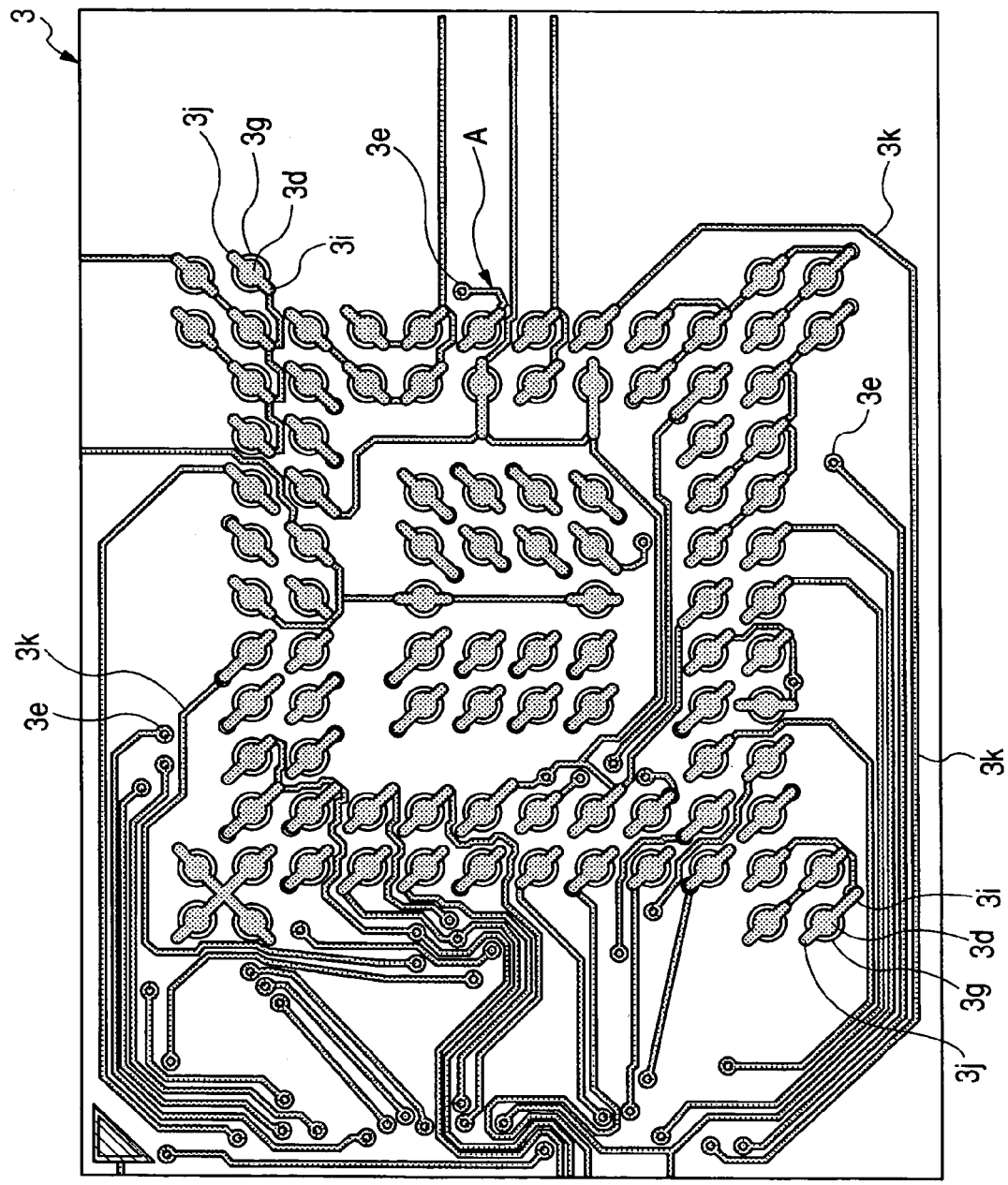
FIG. 9 is a plan view showing an example of the wiring pattern of a wiring substrate used for the semiconductor device of the modification shown in FIG. 6.
Figure 10:
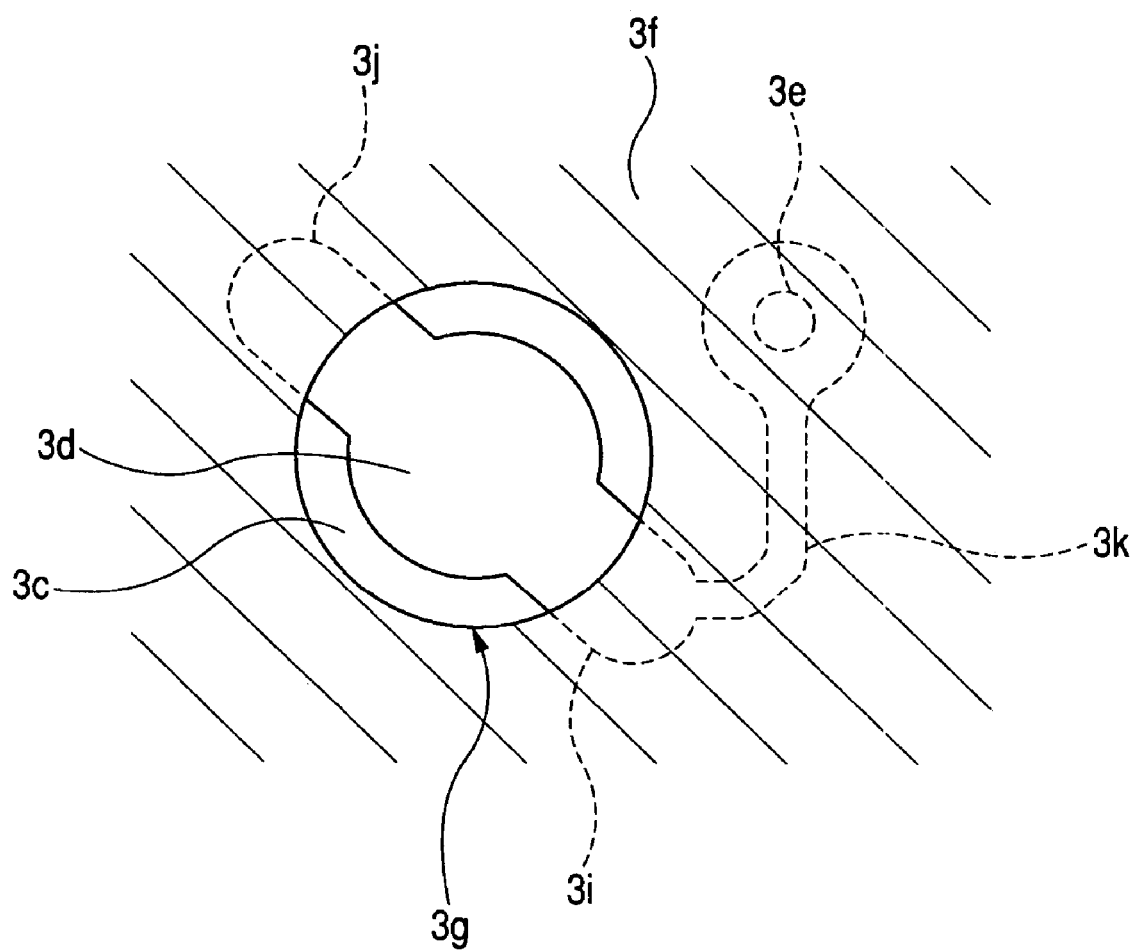
FIG. 10 is an enlarged partial plan view showing the structure of the section A shown in FIG. 9.

FIG. 1 is a cutaway view showing an example of the arrangement relation between a chip and a land in the structure of the semiconductor device of the Embodiment of the present invention, FIG. 2 is a cross-sectional view showing an example of the structure of the semiconductor device shown in FIG. 1, FIG. 3 is an enlarged partial sectional view showing an example of the structure of the semiconductor device shown in FIG. 2, FIG. 4 is a partial plan view showing an example of the structure of the land of the semiconductor device shown in FIG. 1, FIG. 5 is a cross-sectional view showing the structure cut along the A-A line of FIG. 4, FIG. 6 is a cutaway view showing the arrangement relation between a chip and a land in the structure of the semiconductor device of the modification of the Embodiment of the present invention, FIG. 7 is a cross-sectional view showing the structure of the semiconductor device of the modification shown in FIG. 6, FIG. 8 is an enlarged partial sectional view showing an example of the structure of the semiconductor device shown in FIG. 7, FIG. 9 is a plan view showing an example of the wiring pattern of a wiring substrate used for the semiconductor device of the modification shown in FIG. 6, and FIG. 10 is an enlarged partial plan view showing the structure of the section A shown in FIG. 9.

Figure 11:
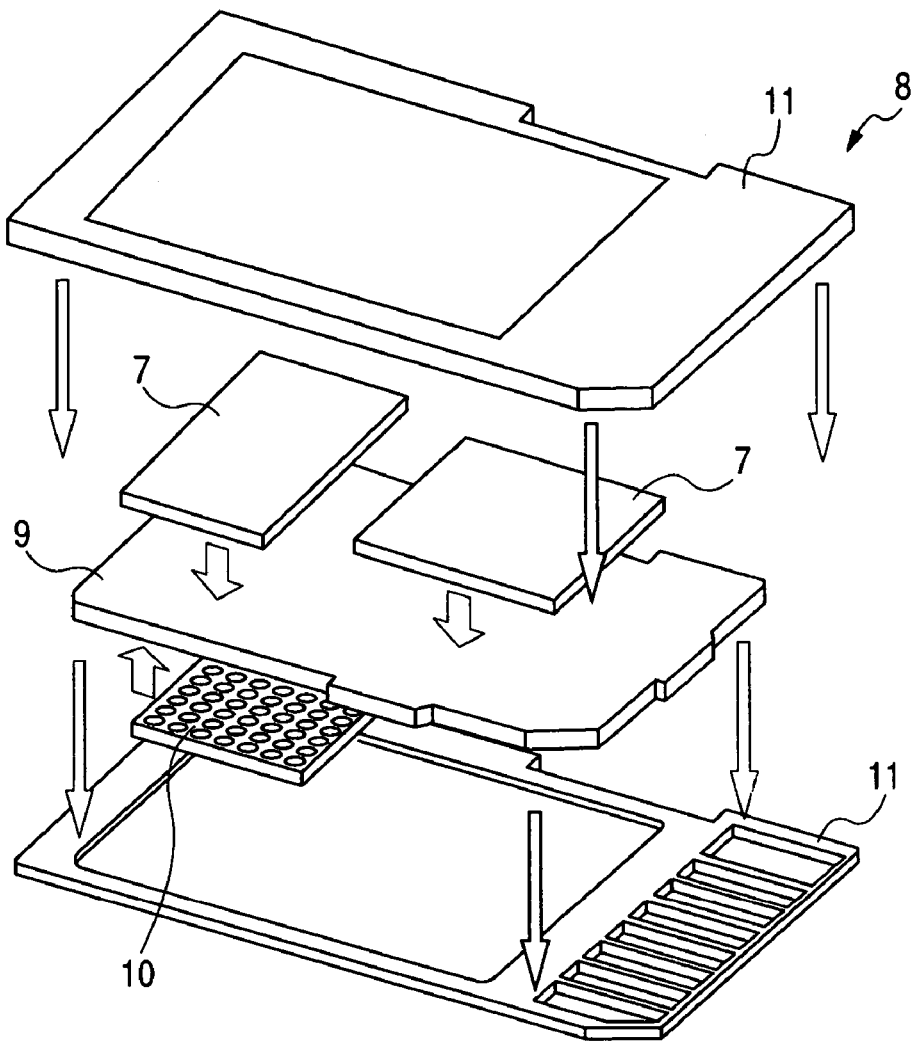
FIG. 11 is a perspective view showing an example of the internal structure of the card shape electronic device to which the semiconductor device shown in FIG. 1 is incorporated.
Figure 12:
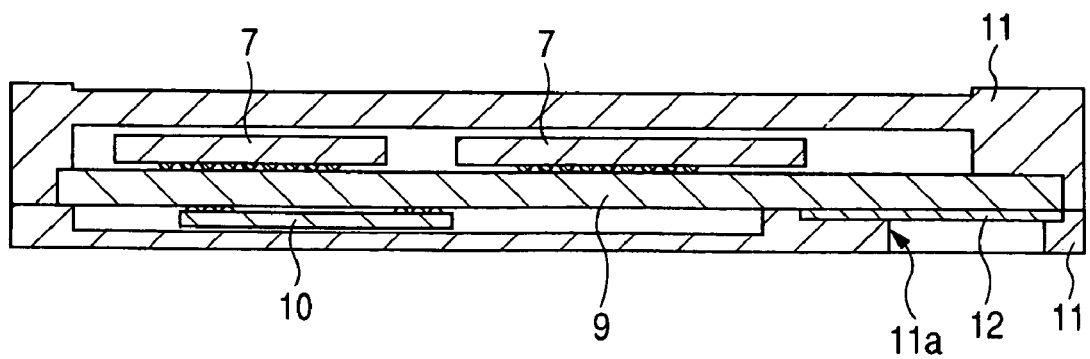
FIG. 12 is a cross-sectional view showing an example of the structure of the card shape electronic device shown in FIG. 11.
Figure 13:
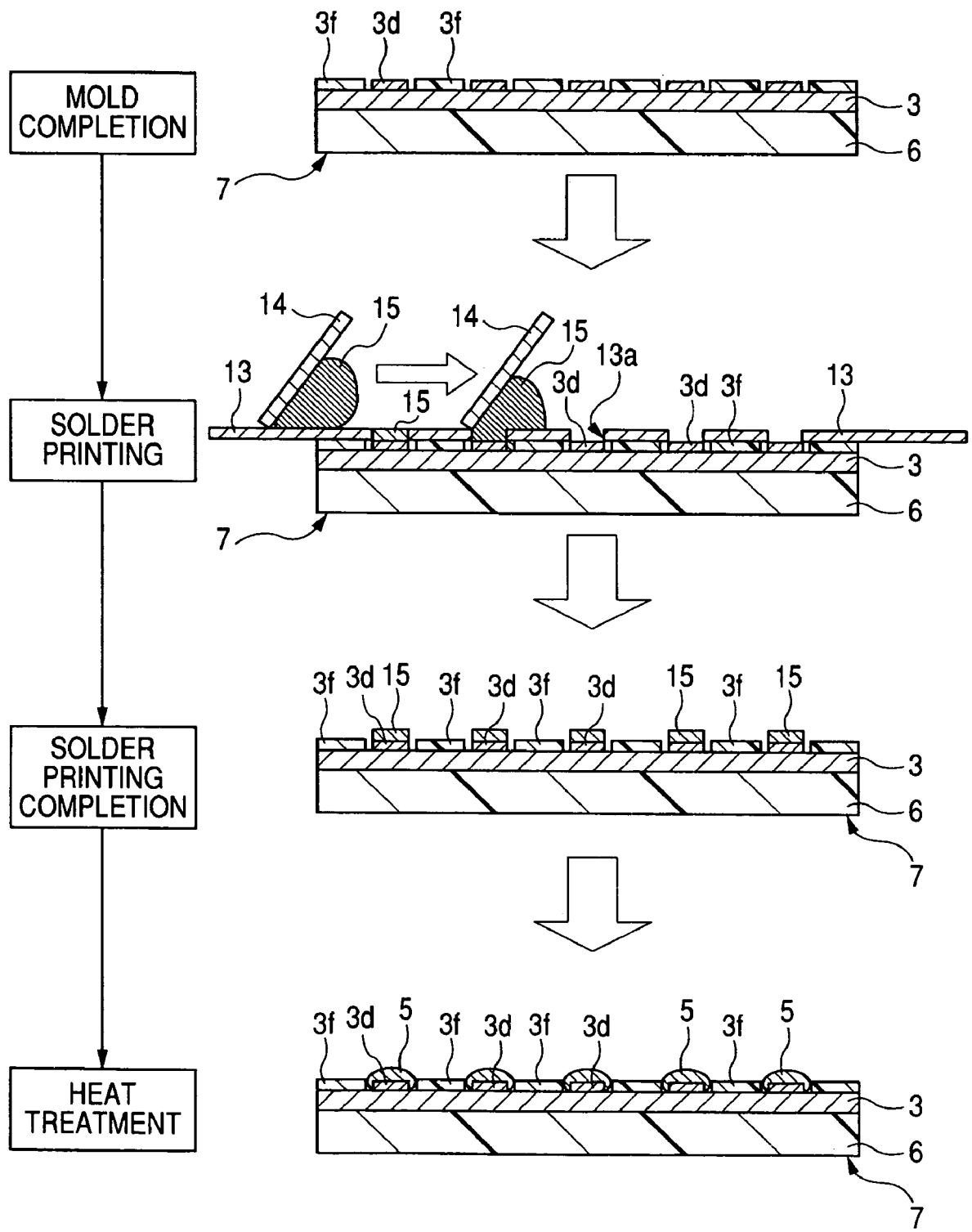
FIG. 13 is a printing process flow figure showing an example of the solder printing procedure in the assembly of the semiconductor device shown in FIG. 1.

And, FIG. 11 is a perspective view showing an example of the internal structure of the card shape electronic device to which the semiconductor device shown in FIG. 1 is incorporated, FIG. 12 is a cross-sectional view showing an example of the structure of the card shape electronic device shown in FIG. 11, and FIG. 13 is a printing process flow figure showing an example of the solder printing procedure in the assembly of the semiconductor device shown in FIG. 1.

Figure 14:
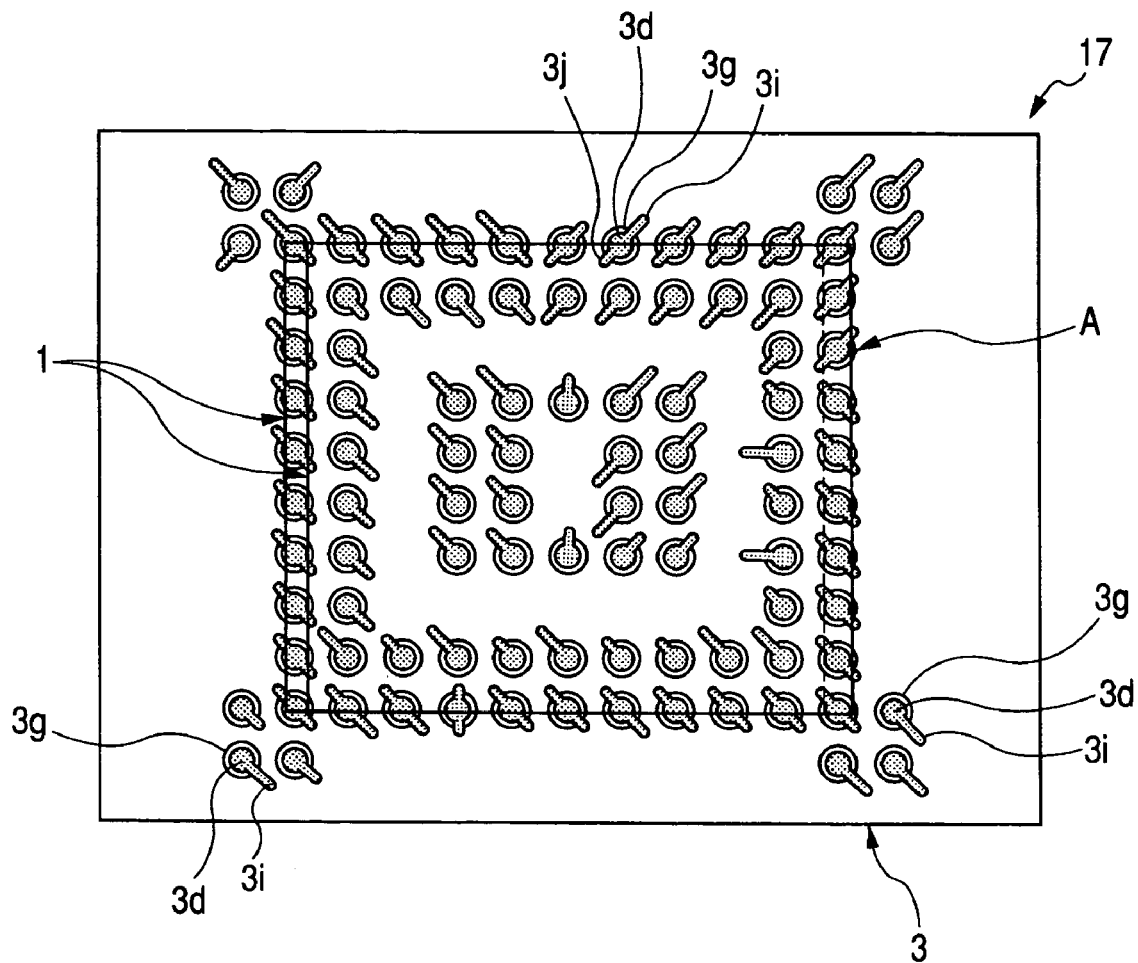
FIG. 14 is a cutaway view showing the arrangement relation between a chip and a land in the semiconductor device of the modification of the Embodiment of the present invention.
Figure 15:
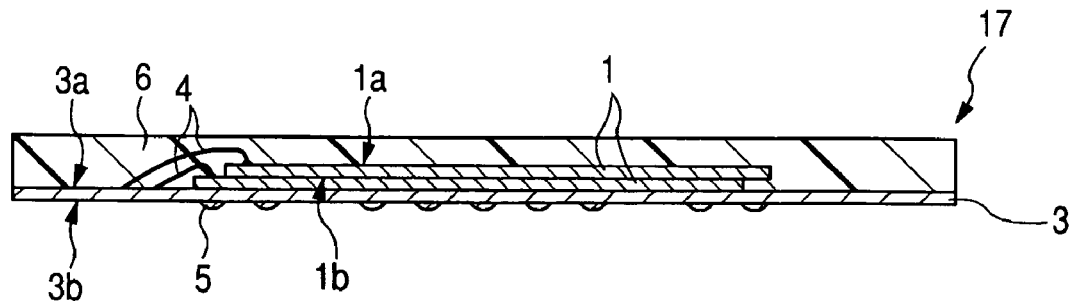
FIG. 15 is a cross-sectional view showing the structure of the semiconductor device of the modification shown in FIG. 14.
Figure 16:
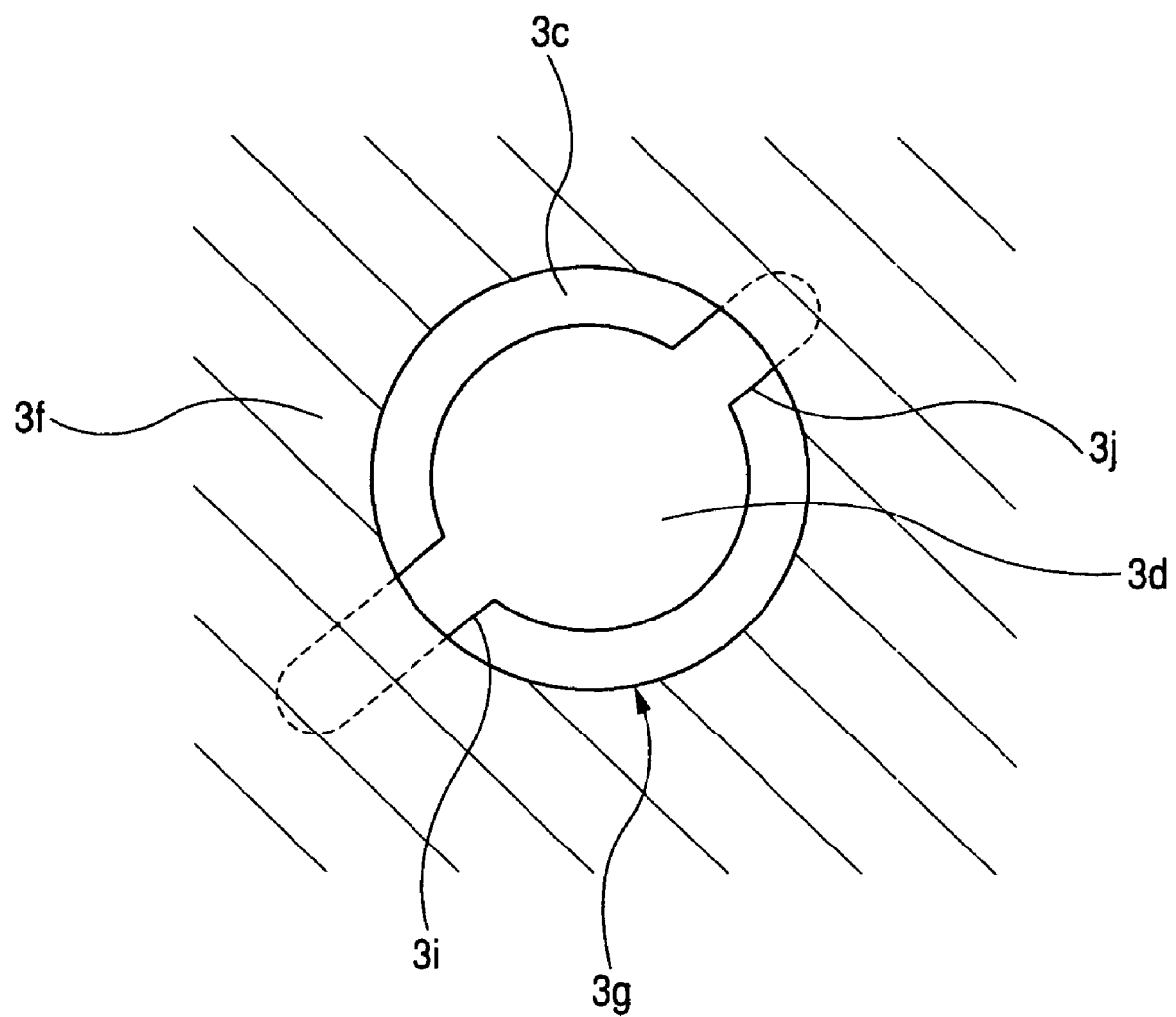
FIG. 16 is an enlarged partial plan view showing the structure of the section A shown in FIG. 14.
Figure 17:
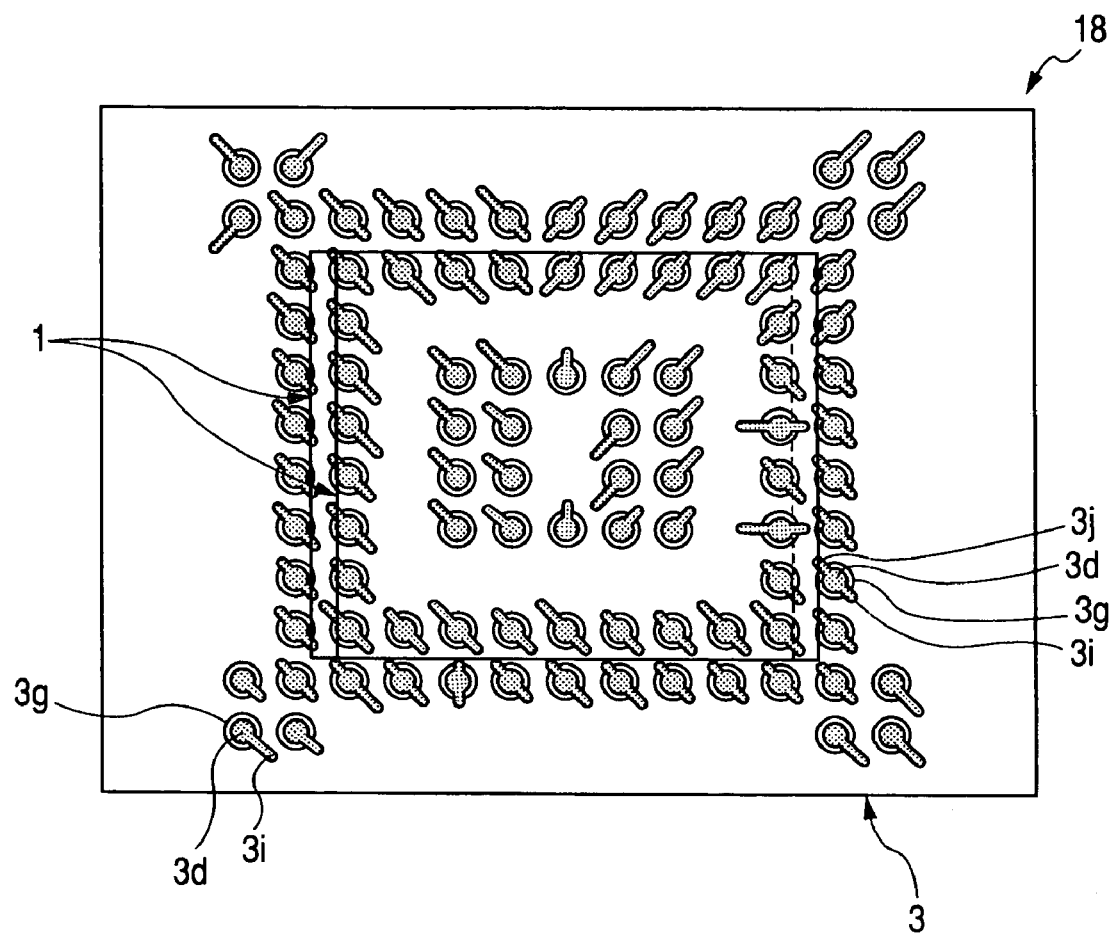
FIG. 17 is a cutaway view showing the arrangement relation between a chip and a land in the semiconductor device of the modification of the Embodiment of the present invention.
Figure 18:
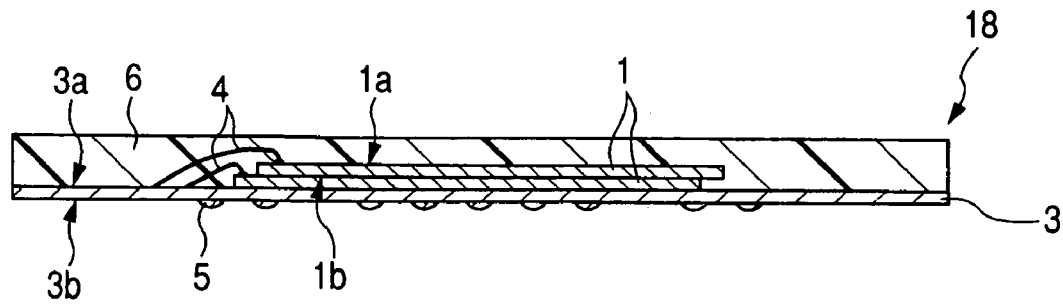
FIG. 18 is a cross-sectional view showing the structure of the semiconductor device of the modification shown in FIG. 17.

Further, FIG. 14 is a cutaway view showing the arrangement relation between a chip and a land in the semiconductor device of the modification of the Embodiment of the present invention, FIG. 15 is a cross-sectional view showing the structure of the semiconductor device of the modification shown in FIG. 14, FIG. 16 is an enlarged partial plan view showing the structure of the section A shown in FIG. 14, FIG. 17 is a cutaway view showing the arrangement relation between a chip and a land in the semiconductor device of the modification of the Embodiment of the present invention, and FIG. 18 is a cross-sectional view showing the structure of the semiconductor device of the modification shown in FIG. 17.

Figure 19:
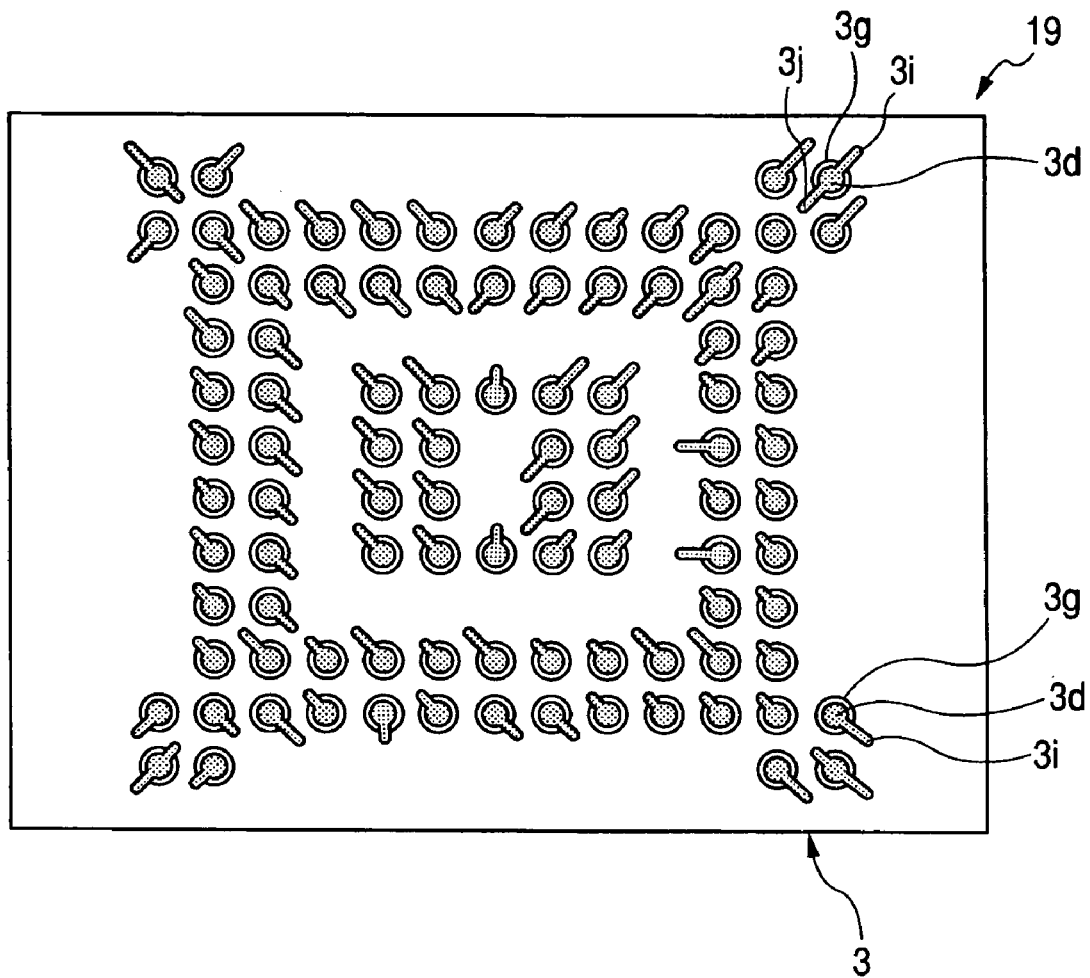
FIG. 19 is a plan view showing the structure at the time of forming dummy wiring at one pin of the corner part of a wiring substrate used for the semiconductor device of the modification of the Embodiment of the present invention.
Figure 20:
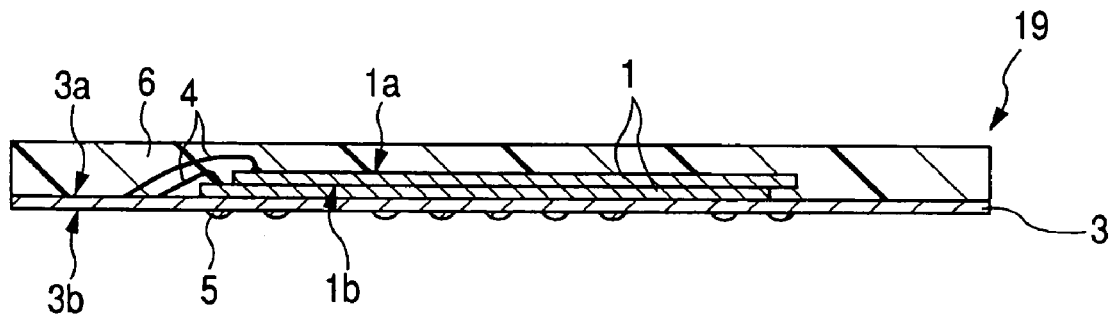
FIG. 20 is a cross-sectional view showing the structure of the semiconductor device of a modification using the wiring substrate shown in FIG. 19.
Figure 21:
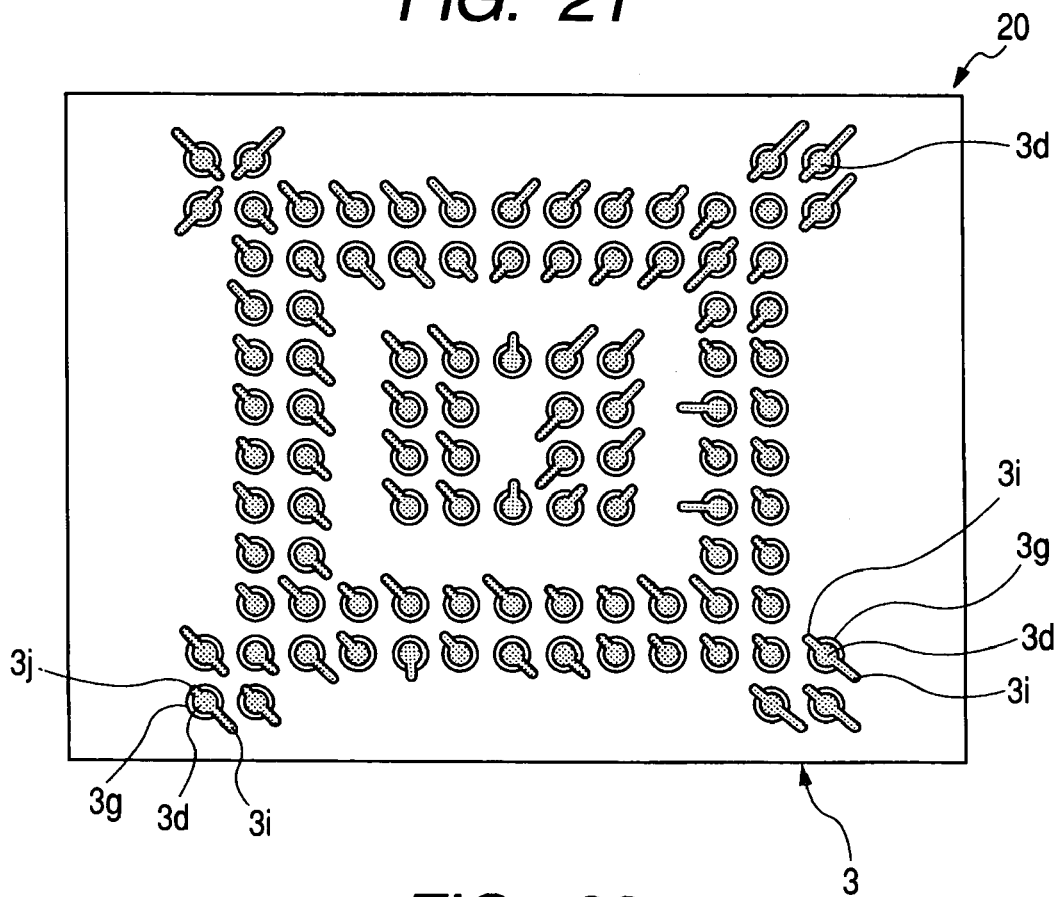
FIG. 21 is a plan view showing the structure at the time of forming dummy wiring at three pins of the corner part of a wiring substrate used for the semiconductor device of the modification of the Embodiment of the present invention.
Figure 22:
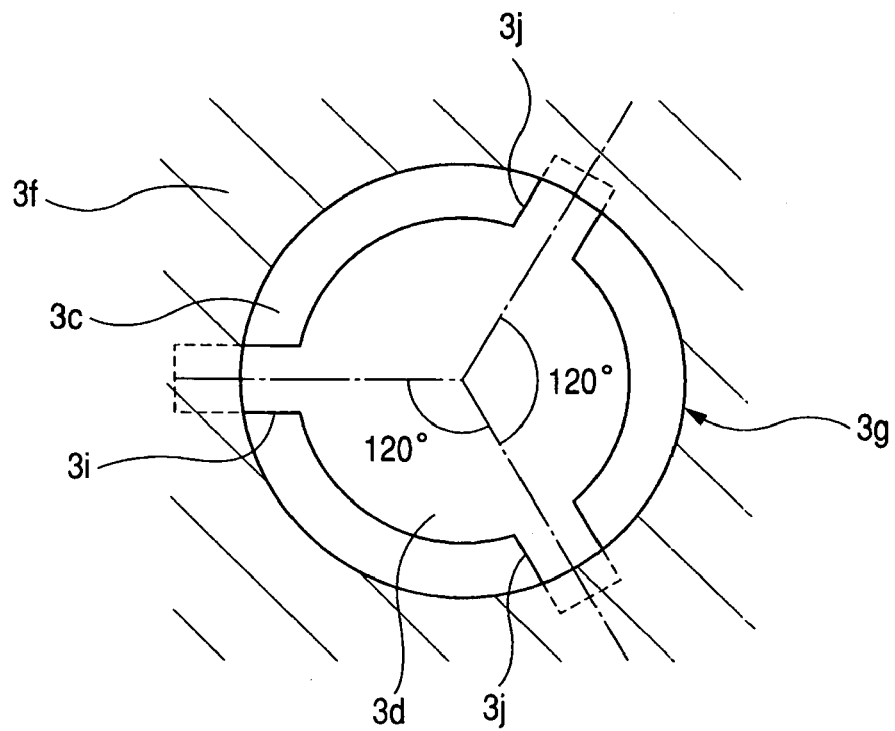
FIG. 22 is a partial plan view showing the land structure at the time of making into three the number of wiring taking out in the wiring substrate used for the semiconductor device of the modification of the Embodiment of the present invention.

And, FIG. 19 is a plan view showing the structure at the time of forming dummy wiring at one pin of the corner part of a wiring substrate used for the semiconductor device of the modification of the Embodiment of the present invention, FIG. 20 is a cross-sectional view showing the structure of the semiconductor device of a modification using the wiring substrate shown in FIG. 19, FIG. 21 is a plan view showing the structure at the time of forming dummy wiring at three pins of the corner part of a wiring substrate used for the semiconductor device of the modification of the Embodiment of the present invention, and FIG. 22 is a partial plan view showing the land structure at the time of making into three the number of wiring taking out in the wiring substrate used for the semiconductor device of the modification of the Embodiment of the present invention.

The semiconductor device of this Embodiment shown in FIG. 1-FIG. 3 is the semiconductor package of a resin molded type in which semiconductor chip 1 was mounted on the wiring substrate. The semiconductor device is built into memory cards (card shape electronic device) 8 shown in FIG. 11, such as an SD card, therefore thickness reduction is required. So, this Embodiment takes up and explains LGA 7 which can be formed still more thinly as compared with BGA etc. as an example of the semiconductor device.

The structure of LGA 7 is explained. Package substrate (wiring substrate) 3 which has main surface 3a, back surface 3b opposite to main surface 3a, a plurality of lands 3d formed on back surface 3b, and a plurality of wirings connected to each of the lands 3d, semiconductor chip 1 mounted on main surface 3a of package substrate 3, a plurality of wires (conductive member) 4 which electrically connect package substrate 3 and semiconductor chip 1, and sealing body 6 which makes the resin seal of the semiconductor chip 1 are included.

Since LGA 7 is incorporated as a memory device in memory card 8, semiconductor chip 1 built in LGA 7 is laminated to many stages according to the capacity needed while being the memory chip provided with the memory circuit. LGA 7 shown in FIG. 1-FIG. 3 is a thing of the structure where two semiconductor chips 1 were laminated to two stages, and each semiconductor chip 1 is connected via die bond material 2, such as an adhesion sheet, for example.

Namely, as shown in FIG. 2 and FIG. 3, semiconductor chip 1 of the first stage is adhered on main surface 3a of package substrate 3 via die bond material 2, further semiconductor chip 1 of the second stage is mounted via die bond material 2 on main surface 1a of semiconductor chip 1 of the first stage, and main surface 1a of semiconductor chip 1 of the first stage and back surface 1b of semiconductor chip 1 of the second stage are adhered by die bond material 2.

As shown in FIG. 3, resist layers 3f which are insulating films are formed on back-and-front both faces of core material 3c at package substrate 3. A plurality of electrodes 3h for bonding connected to wire 4 are formed in openings 3g of resist layers 3f at the side of main surface 3a, and a plurality of lands 3d are further formed in openings 3g of resist layers 3f at the side of back surface 3b.

As shown in FIG. 4, each land 3d is formed so that the edge part may be exposed to openings 3g of resist layers 3f. That is, land 3d formed in package substrate 3 of LGA 7 of this Embodiment is land 3d of NSMD structure altogether, and the edge part comprising side faces of an each land 3d has been exposed in openings 3g of resist layers 3f. Therefore, in opening 3g of resist layers 3f, core material 3c of package substrate 3 is exposed to the perimeter of a land 3d. In FIG. 4, a hatching part is a region covered with resist layers 3f (the same may be said of FIG. 10, FIG. 16, and FIG. 22).

FIG. 1 penetrates and shows the arrangement of a plurality of lands 3d which were formed on back surface 3b of package substrate 3 from the main surface 3a side of package substrate 3.

As shown in FIG. 1, in LGA 7 of this Embodiment, the first wiring and the second wiring which have been arranged mutually in the location of 180° symmetry are connected to all the lands 3d formed on back surface 3b of package substrate 3.

That is, as shown in FIG. 4 and FIG. 5, the first wiring and the second wiring which have been arranged mutually in the location of 180° symmetry are connected to each land 3d. For example, the first wiring is output wiring 3i, and the second wiring is dummy wiring 3j (however, the first wiring may be dummy wiring 3j, and the second wiring may be wiring 3i).

As for the spatial relationship of a plurality of wirings connected to each land 3d, they are arranged so that the arrangement angle of the mutual wiring is 360°/the number of connection wirings. Since the number of wirings connected to each land 3d is two in the case of this Embodiment, it becomes 360°/2=180° and output wiring 3i and dummy wiring 3j are arranged in all the lands 3d mutually in the location of 180° symmetry.

Output wiring 31 is a wiring connected with the wiring of a signal system, GND, or a power source, for example. On the other hand, dummy wiring 3j is a non connection wiring, or a wiring connected with adjacent land 3d.

In LGA 7, the number of wirings connected to each of all the lands 3d which were formed on back surface 3b of package substrate 3 is the same number. That is, in all the lands 3d, the wirings connected have become two, taking-out wiring 3i and dummy wiring 3j, and unification of the number of taking out of a wiring of each land 3d is aimed at in package substrate 3.

In LGA 7 of this Embodiment, as shown in FIG. 3, solder coat (solder) 5 formed by solder printing is arranged at each of a plurality of lands 3d of back surface 3b of package substrate 3, and the height (T) of solder coat 5 is less than or equal to 100□m (T≦100 μm) in the case. Namely, the height from the surface to the peak of land 3d in solder coat 5 formed by solder printing has become 100 μm or less, and the JEDEC (Joint Electron Device Engineering Council standards) standard of the LGA type package is satisfied.

Each land 3d of package substrate 3, and the wiring of output wiring 3i, dummy wiring 3j, etc. which is connected to this include copper alloy, for example.

Semiconductor chip 1 is formed of silicon etc., for example, and an integrated circuit is formed in the main surface 1a. Wire 4 which electrically connects semiconductor chip 1, and electrodes 3h for bonding of package substrate 3 is a gold wire, for example.

Sealing body 6 which makes the resin seal of semiconductor chip 1 and a plurality of wires 4 is formed of thermosetting epoxy resin etc., for example.

Next, the semiconductor device shown in FIG. 6 and FIG. 7 is LGA 16 of the modification of this Embodiment, and in order to aim at the increase in a memory as a memory device, it laminates semiconductor chip 1 which is a memory chip to four stages. Output wiring 3i and dummy wiring 3j which have been arranged mutually in the location of 180° symmetry are connected to each land 3d like LGA 7.

Here, FIG. 6 penetrates and shows an arrangement a plurality of lands 3d which were formed on back surface 3b of package substrate 3 from the main surface 3a side of package substrate 3.

FIG. 9 shows the wiring pattern of package substrate 3 of LGA 16, and a part of output wiring 3i is connected to through hole 3e via the main wiring 3k, as shown in FIG. 10.

As shown in FIG. 8, also in LGA 16, solder coat 5 formed by solder printing is arranged at each of a plurality of lands 3d of back surface 3b of package substrate 3. The height (T) of solder coat 5 is 100 μm or less (T≦100 μm) in the case.

Next, FIG. 11 and FIG. 12 show the structure of memory card 8 which is an example of the card shape electronic device in which LGA 7 is mounted. Two LGA's 7 are mounted on the front surface side of substrate 9 for cards, and, on the other hand, CSP (Chip Size Package) 10 which is a package for control is mounted on the back surface side. Here, since LGA 7 explained in this Embodiment is the structure where semiconductor chip 1 was laminated, the thickness of the semiconductor device becomes high rather than CSP 10 mounted on the back surface side of substrate 9 for cards of memory card 8. Therefore, it is preferred to adopt a LGA type package as a semiconductor device in which semiconductor chip 1 for memories is laminated. Two LGA's 7 of a front surface side and CSP 10 of the back surface side are covered by case 11 of a front surface side, and case 11 of the back surface side, respectively. As shown in FIG. 12, a plurality of external terminals 12 formed on the back surface side of substrate 9 for cards are exposed to opening 11a of case 11 of a back surface side.

Next, the manufacturing method of LGA 7 of this Embodiment is explained.

First, package substrate 3 having a plurality of lands 3d to which output wiring 3i and dummy wiring 3j arranged mutually in the location of 180° symmetry are connected, and which are NSMD structure at the back surface 3b is prepared.

Then, semiconductor chip 1 of the first stage is mounted via die bond material 2 on main surface 3a of package substrate 3. Then, semiconductor chip 1 of the second stage is mounted via die bond material 2 on semiconductor chip 1 of the first stage.

Then, semiconductor chip 1 of the first stage and electrodes 3h for bonding of package substrate 3 are electrically connected with wire 4, and semiconductor chip 1 of the second stage and electrodes 3h for bonding of package substrate 3 are electrically further connected with wire 4.

Then, a resin seal is performed and sealing body 6 is formed. That is, it is considered as the mold completion which makes the resin seal of semiconductor chip 1 and a plurality of wires 4, and is shown in FIG. 13, and sealing body 6 is formed.

Then, solder printing of FIG. 13 which prints solder to each land 3d is performed. That is, solder is formed by printing with a solder printing method on each land 3d of back surface 3b of package substrate 3. Printing mask 13 is first arranged on main surface 3b of package substrate 3 in the case. At this time, an opening 13a of printing mask 13 and the location of land 3d are matched and arranged.

Then, soldering paste 15 is applied on each land 3d by squeegee 14 on printing mask 13. That is, soldering paste 15 is applied on each land 3d, embedding soldering paste 15 in opening 13a of printing mask 13 by squeegee 14.

This becomes solder printing completion, as shown in FIG. 13.

Then, the heat treatment shown in FIG. 13 is performed, and solder coat 5 is formed on each land 3d.

According to the manufacturing method of LGA 7 of this Embodiment, after a LGA assembly, by printing solder with a printing method to each land 3d, using package substrate 3 which has a plurality of lands 3d of NSMD structure, and output wiring 3i and dummy wiring 3j which are connected to each land 3d, and have been arranged mutually in the location of 180° symmetry, the area of the wetting breadth of the solder between lands can be made the same since the number of output wiring from land 3d is unified to two.

Hereby, the variation in the height of solder coat 5 between lands can be reduced.

As a result, improvement in the mountability of LGA (semiconductor device) 7 can be aimed at.

That is, improvement in the mountability can be aimed at in LGA (semiconductor device) 7 for memory card 8 mounting which raised soldering connection strength by making each land 3d into NSMD structure while suppressing package height by making the height of solder coat 5 formed on a plurality of lands 3d into 100□m or less.

Since the solder on land 3d is pulled by opposite both directions almost uniformly corresponding to the directions of output wiring 3i and dummy wiring 3j which have been arranged in the location of 180° symmetry by arranging out output wiring 3i and dummy wiring 3j which are connected to each land 3d mutually in a location of 180° symmetry, the location of the peak of solder can be arranged to the mostly central part of land 3d. Hereby, a location drift of solder coat 5 between lands can be reduced.

As a result, the generation of contact failure of solder coat 5 of LGA 7 and the terminal of a socket at the time of testing in a screening step can be prevented, and improvement in the mountability of LGA 7 can be aimed at.

By arranging output wiring 3i and dummy wiring 3j which are connected to land 3d mutually in a location of 180° symmetry, the stress concerning the taking out portion of the wiring in land 3d after mounting LGA 7 on a mounting substrate can be dispersed and decreased.

As a result, the generation of disconnection in the taking out portion of a wiring in land 3d can be prevented, and improvement in the mountability of LGA 7 can be aimed at.

Next, the modification of this Embodiment shown in FIG. 14-FIG. 22 is explained.

The modification shown in FIG. 14-FIG. 21 connects output wiring 3i and dummy wiring 3j to not all lands 3d, but connects output wiring 3i and dummy wiring 3j only to a part of lands 3d.

FIG. 14, FIG. 17, FIG. 19, and FIG. 21 penetrate and show the arrangement of a plurality of lands 3d which were formed on back surface 3b of package substrate 3 from the main surface 3a side of package substrate 3.

First, in the modification shown in FIG. 14-FIG. 18, output wiring 3i and dummy wiring 3j are connected to each of a plurality of lands 3d which have been arranged in the location corresponding to the edge part of main surface 1a of semiconductor chip 1. That is, output wiring 3i and dummy wiring 3j are connected only to land 3d arranged in the location directly under the neighborhood of the end portion (edge part) of semiconductor chip 1.

Among these, in LGA 17 of the modification shown in FIG. 14 and FIG. 15, when the end portion (edge part) of semiconductor chip 1 overlaps with the location of land 3d, output wiring 3i and dummy wiring 3j are connected to these lands 3d as shown in FIG. 16.

In LGA 18 of the modification shown in FIG. 17 and FIG. 18, when the end portion (edge part) of semiconductor chip 1 is arranged between lands, output wiring 3i and dummy wiring 3j are connected to land 3d for two rows arranged at the both sides of this chip end portion.

As described above, since semiconductor chip 1 and package substrate 3 are formed with different materials, respectively, a difference generates also in these coefficients of thermal expansion. However, by connecting output wiring 3i and dummy wiring 3j to a plurality of lands 3d arranged in the location corresponding to the edge part of main surface 1a of semiconductor chip 1, when the stress in a chip end portion generated with the difference of the coefficient of thermal expansion of semiconductor chip 1, and the resin for sealing and a substrate is given to land 3d in a heat cycle test etc., the stress applied to land 3d can be dispersed and decreased.

As a result, the generation of disconnection in the taking out portion of a wiring in this land 3d can be prevented.

In the modification shown in FIG. 19-FIG. 21, output wiring 3i and dummy wiring 3j are connected to land 3d arranged from the central part of the plane direction of package substrate 3 in the location where distance is the longest. That is, output wiring 3i and dummy wiring 3j are connected only to land 3d arranged near the corner part of the outermost periphery in land arrangement.

Among these, in LGA 19 of the modification shown in FIG. 19 and FIG. 20, output wiring 3i and dummy wiring 3j are connected to land 3d of only one pin of the corner part of the outermost periphery of land arrangement.

In LGA 20 of the modification shown in FIG. 21, output wiring 3i and dummy wiring 3j are connected to each of lands 3d of three pins of the corner part of the outermost periphery of land arrangement.

The stress generated when package substrate 3 deforms (warp) by thermal contraction etc. becomes higher, as it separates (distant location) from the center of package substrate 3. However, by connecting output wiring 3i and dummy wiring 3j only to land 3d arranged near the corner part of the outermost periphery in land arrangement, the stress applied to land 3d near the corner part of the outermost periphery in the land arrangement of package substrate 3 can be dispersed and decreased.

As a result, the generation of disconnection in the taking out portion of a wiring in this land 3d can be prevented.

Next, the modification shown in FIG. 22 shows wiring taking out arrangement in case the wiring connected to land 3d is three.

Namely, since the arrangement is performed so that the arrangement angle of the mutual wiring is 360°/number of connection wirings as to the spatial relationship of a plurality of wirings connected to land 3d in the semiconductor device of this Embodiment, what is necessary is to form dummy wiring 3j at an angle of 120° in land 3d, it becoming 360°/3=120° when the number of wirings connected to land 3d is three.

Thus, even when dummy wiring 3j is formed at an angle of 120°, the same effect as the case of forming in a location of 180° symmetry can be acquired.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

For example, in the Embodiment, in LGA (semiconductor device), although the case where the numbers of laminations of semiconductor chip 1 were two stages and four stages was taken up and explained to the example, semiconductor chip 1 may be one stage of mounting, or may be two or more stages of laminations except two stages and four stages.

The number of wirings connected to land 3d should just be plural of two or more, in the case, dummy wiring 3j does not necessarily need to be included, for example, all wirings connected to land 3d may be output wiring 3i.

The present invention is suitable for the semiconductor device which performs solder coating, and its manufacturing technology.

What is claimed is:

1. A method of manufacturing a semiconductor device, comprising the steps of:
   (a) preparing a wiring substrate which has a main surface, a back surface opposite to the main surface, an insulating film formed over the back surface, a plurality of lands which are formed over the back surface, and whose edge part exposes to an opening of the insulating film, and a first and a second wirings that are connected to each of the lands, and are arranged mutually in a location of 180° symmetry;
   (b) mounting a semiconductor chip over the main surface of the wiring substrate;
   (c) electrically connecting the semiconductor chip and the wiring substrate;
   (d) sealing the semiconductor chip; and
   (e) printing solder by a printing method to the lands.

2. A method of manufacturing a semiconductor device according to claim 1, wherein the first and the second wirings are connected to each of all of the lands formed over the back surface of the wiring substrate.

3. A method of manufacturing a semiconductor device according to claim 1, wherein the first and the second wirings are connected to each of the lands arranged in a location corresponding to an edge part of the main surface of the semiconductor chip.

4. A method of manufacturing a semiconductor device according to claim 1, wherein the first and the second wirings are connected to the land arranged from a central part of a plane direction of the wiring substrate in a location where distance is a longest.

5. A method of manufacturing a semiconductor device according to claim 1, wherein the semiconductor device is an LGA.

6. A method of manufacturing a semiconductor device according to claim 1, wherein at the step (b), a plurality of the semiconductor chips are laminated over the main surface of the wiring substrate.

7. A method of manufacturing a semiconductor device according to claim 1, wherein either is a dummy wiring between the first and the second wirings.

8. A method of manufacturing a semiconductor device, comprising the steps of:

(a) preparing a wiring substrate which has a main surface, a back surface opposite to the main surface, an insulating film formed over the back surface, a plurality of lands which are formed over the back surface, and whose edge part exposes to an opening of the insulating film, and a plurality of wirings which are connected to each of the lands, and are arranged so that a mutual arrangement angle is 360°/number of connection wirings;

(b) mounting a semiconductor chip over the main surface of the wiring substrate;

(c) electrically connecting the semiconductor chip and the wiring substrate;

(d) sealing the semiconductor chip; and (e) printing solder by a printing method to the lands.

9. A method of manufacturing a semiconductor device according to claim 8, wherein the semiconductor device is an LGA.

10. A method of manufacturing a semiconductor device according to claim 8, wherein at the step (b), a plurality of the semiconductor chips are laminated over the main surface of the wiring substrate.

11. A method of manufacturing a semiconductor device according to claim 8, wherein either of the wirings is a dummy wiring.

* * * * *